(12) United States Patent
Guevara et al.

(10) Patent No.: US 11,081,456 B2
(45) Date of Patent: Aug. 3, 2021

(54) TEXTURED BOND PADS

(71) Applicant: TEXAS INSTRUMENTS INCORPORATED, Dallas, TX (US)

(72) Inventors: Rafael Jose Lizares Guevara, Makati (PH); Aniceto Tabangcura Rabilas, Jr., Baguio (PH); Ray Fredric Solis de Asis, Mabalacat (PH); Sylvester Tigno Sanchez, Manila (PH); Alvin Lopez Andaya, Calasiao (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 10 days.

(21) Appl. No.: 16/554,025

(22) Filed: Aug. 28, 2019

(65) Prior Publication Data

US 2021/0066220 A1 Mar. 4, 2021

(51) Int. Cl.
*H01L 23/00* (2006.01)
*H01L 21/56* (2006.01)
*H01L 23/495* (2006.01)

(52) U.S. Cl.
CPC .............. *H01L 24/05* (2013.01); *H01L 21/56* (2013.01); *H01L 23/4952* (2013.01); *H01L 24/03* (2013.01); *H01L 24/85* (2013.01); *H01L 2224/03462* (2013.01); *H01L 2224/03831* (2013.01); *H01L 2224/04042* (2013.01); *H01L 2224/05017* (2013.01); *H01L 2224/05082* (2013.01); *H01L 2224/05147* (2013.01); *H01L 2224/05155* (2013.01); *H01L 2224/05557* (2013.01); *H01L 2224/05573* (2013.01); *H01L 2224/05664* (2013.01)

(58) Field of Classification Search
CPC ......... H01L 24/05; H01L 24/85; H01L 21/56; H01L 23/4952; H01L 24/03
See application file for complete search history.

(56) References Cited

U.S. PATENT DOCUMENTS

2012/0280407 A1* 11/2012 Do ...................... H01L 21/4832
257/778

* cited by examiner

*Primary Examiner* — Anthony Ho
(74) *Attorney, Agent, or Firm* — Ronald O. Neerings; Charles A. Brill; Frank D. Cimino

(57) ABSTRACT

In some examples, a package comprises a semiconductor die and a bond pad formed upon the semiconductor die. The bond pad has a protrusion on a top surface of the bond pad. The package also comprises a metal contact and a bond wire coupled to the protrusion and to the metal contact.

30 Claims, 16 Drawing Sheets

TEXTURED BOND PADS

BACKGROUND

Semiconductor chips are typically housed inside packages that protect the chips from deleterious environmental influences, such as heat, moisture, and debris. A packaged chip communicates with electronic devices outside the package via leads that are exposed to surfaces of the package. Within the package, the chip may be electrically coupled to the leads using any suitable technique. One such technique is wire bonding, in which one end of a conductive wire (also known as a bond wire) is coupled to a lead and the other end of the wire is coupled to the chip. In particular, the wire couples to the chip by coupling to a bond pad on the surface of the chip, i.e., on the surface of the semiconductor die on and in which a circuit has been formed.

SUMMARY

In some examples, a package comprises a semiconductor die and a bond pad formed upon the semiconductor die. The bond pad has a protrusion on a top surface of the bond pad. The package also comprises a metal contact and a bond wire coupled to the protrusion and to the metal contact.

In some examples, a method of fabricating a semiconductor device comprises providing a semiconductor substrate and forming a bond pad on the semiconductor substrate. Forming the bond pad includes positioning a metal layer on the semiconductor substrate and chemically etching a top surface of the metal layer to form a textured top surface. The method further comprises providing a metal contact of a leadframe, using a bond wire to form an electrical pathway between the metal contact and the textured top surface of the metal layer, and encapsulating the semiconductor substrate, the bond pad, the bond wire, and at least a portion of the metal contact in a protective housing.

In some examples, a method of fabricating a semiconductor device comprises providing a semiconductor substrate and forming a bond pad on the semiconductor substrate. Forming the bond pad includes providing a stack of metal layers on the semiconductor substrate and forming a protrusion on a top surface of the stack of metal layers. The method further comprises providing a metal contact of a leadframe, using a bond wire to form an electrical pathway between the metal contact and the protrusion, and encapsulating the semiconductor substrate, the bond pad, the bond wire, and at least a portion of the metal contact in a protective housing.

BRIEF DESCRIPTION OF THE DRAWINGS

For a detailed description of various examples, reference will now be made to the accompanying drawings in which.

DETAILED DESCRIPTION

As explained above, packaged dies are sometimes coupled to package leads using a wire bonding technique. While such bond wires are generally useful in exchanging electrical signals between dies and leads, the connection between the bond wire and the bond pad on the die is often weak and thus is susceptible to detachment.

Accordingly, there are disclosed herein various examples of bond pads with textured areas that improve the strength of connections with bond wires. These bond pads have textured surfaces, which increase the surface area to which a bond wire may couple, thereby increasing the strength of the connection and reducing the likelihood of detachment. (The term "top surface" refers to the surface of the bond pad to which a bond wire may couple, and it may also refer to the surface of a metal layer that abuts another metal layer in a metal stack.) In some examples, the top surfaces of the bond pads are textured by a combination of photolithography and chemical etching, thus resulting in a top surface that has a rough, grainy texture. In some examples, the top surfaces of the bond pads are textured by a combination of photolithography and metal deposition, thus resulting in any of a variety of geometric shapes or patterns on the top surface of the bond pad. In some examples, the top surfaces of the bond pads are textured using an additive manufacturing technique, which likewise may produce a variety of geometric shapes or patterns. Textured surfaces are not merely those containing inadvertently formed imperfections that increase surface area; rather, they are intentionally-formed protrusions having specific thicknesses or surfaces having particular roughness profiles, as described below. Details of the structure and manufacture of such bond pads are now described with respect to the drawings.

Figure 1:
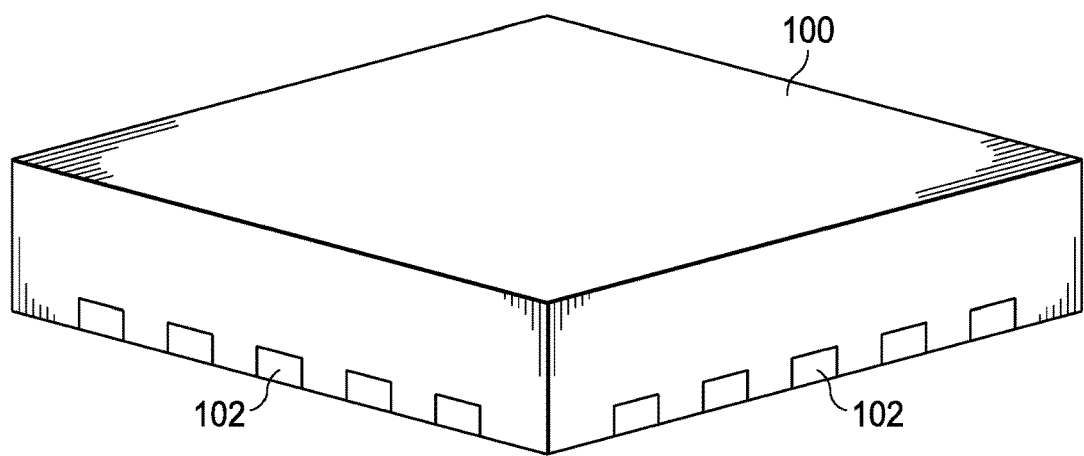
FIG. 1 is a perspective view of an illustrative semiconductor package housing a textured bond pad, in accordance with various examples.

FIG. 1 is a perspective view of an illustrative semiconductor package 100 housing a textured bond pad, in accordance with various examples. The semiconductor package 100 comprises a plurality of metal contacts 102. The semiconductor package 100 may be of any suitable type. In some examples, the semiconductor package 100 comprises a quad flat no-lead (QFN) package, although the textured bond pads disclosed herein may be implemented in any type of package that includes bond wires (e.g., clip QFN packages). Because FIG. 1 depicts only an exterior view of the semiconductor package 100, the textured bond pad is not expressly depicted.

Figure 2:
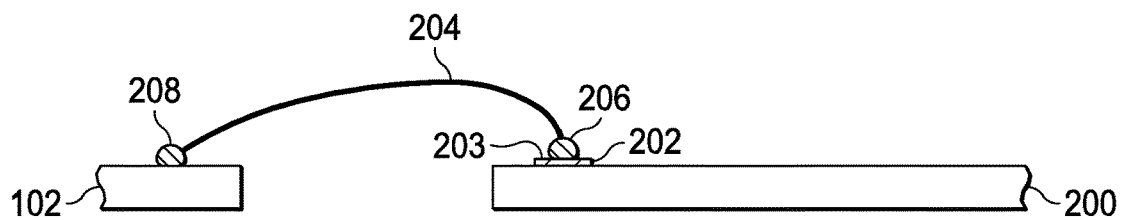
FIG. 2 is a side view of a portion of the contents of an illustrative semiconductor package housing a textured bond pad, in accordance with various examples.

FIG. 2 is a side view of the contents of the illustrative semiconductor package 100 housing a textured bond pad 202, in accordance with various examples. More specifically, FIG. 2 depicts a semiconductor die 200 and the textured bond pad 202 formed on a surface of the semiconductor die 200. FIG. 2 also depicts a metal contact 102 (e.g., a lead) that couples to the bond pad 202 via a bond wire 204. The bond wire 204 couples to the bond pad 202 (and, more specifically, to a top surface 203 of the bond pad 202) using a ball 206, and the bond wire 204 couples to the metal contact 102 using a ball 208. Only some portions of the semiconductor package 100 are depicted in FIG. 2. The specific configuration shown in FIG. 2 is merely illustrative. Any semiconductor package that uses a bond pad for wire-bonding purposes, regardless of the particular configuration, may benefit from the textured bond pads described herein.

Figure 3:
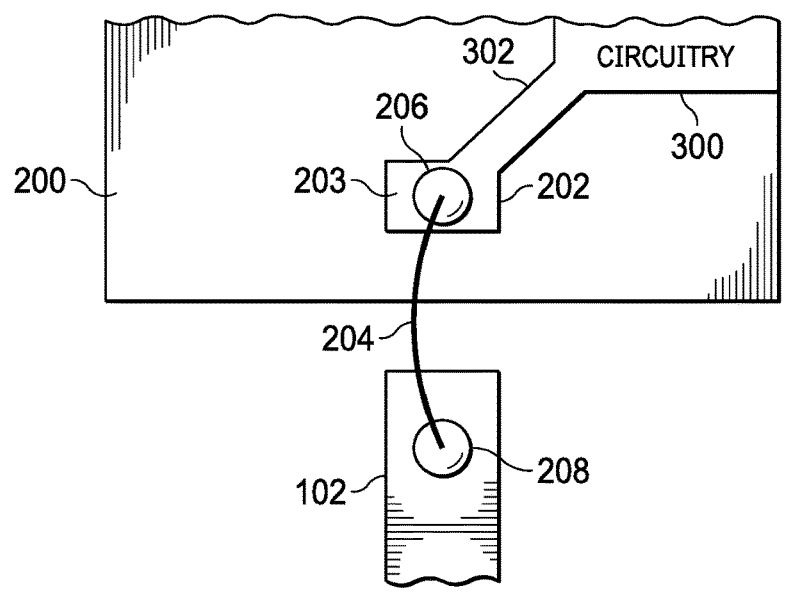
FIG. 3 is a top-down view of a portion of the contents of an illustrative semiconductor package housing a textured bond pad, in accordance with various examples.

FIG. 3 is a top-down view of the configuration of FIG. 2, in accordance with various examples. The top surface of the semiconductor die 200 includes the bond pad 202 coupled via a conductive connection 302 to circuitry 300, such as an integrated circuit (IC). (For simplicity, the circuitry 300 is intentionally omitted from the view of FIG. 2.) The bond wire 204 couples to the top surface 203 of the bond pad 202 via the ball 206, and the bond wire 204 couples to the metal contact 102 via the ball 208. As with FIG. 2, only some portions of the semiconductor package 100 are depicted in FIG. 3. In addition, although the bond pad 202 is a textured bond pad, FIGS. 2-3 omit depictions of the texturing from the top surface 203 for simplicity. Such texturing is described and illustrated in greater detail below.

Figure 4A:
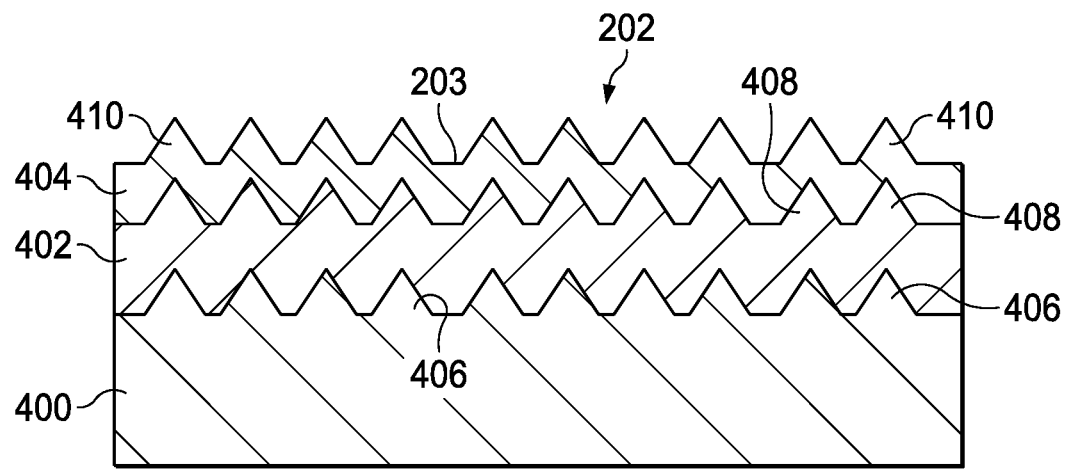
FIG. 4A is a cross-sectional view of an illustrative textured bond pad, in accordance with various examples.

FIG. 4A is a cross-sectional view of an illustrative textured bond pad 202, in accordance with various examples. The example textured bond pad 202 depicted in FIG. 4A includes multiple metal layers 400, 402, and 404. In some examples, the metal layer 400 includes copper. In some examples, the metal layer 402 includes nickel. In some examples, the metal layer 404 includes palladium. In some examples, other metal(s) are used for one or more of these metal layers. In some examples, more or fewer metal layers are used. For instance, in some examples, only a single metal layer (e.g., copper) forms the textured bond pad 202. In some examples, four or more metal layers form the textured bond pad 202. In some examples, one or more metal layers include the same metal. In some examples, all metal layers in the textured bond pad 202 are different. In some examples, one or more metal layers include one or more metal alloys. Notwithstanding these various contemplated permutations, most of the remainder of this disclosure assumes the use of three distinct metal layers (copper, nickel, and palladium) in the textured bond pad 202. The scope of this disclosure, however, is not limited to this particular example.

Figure 4B:
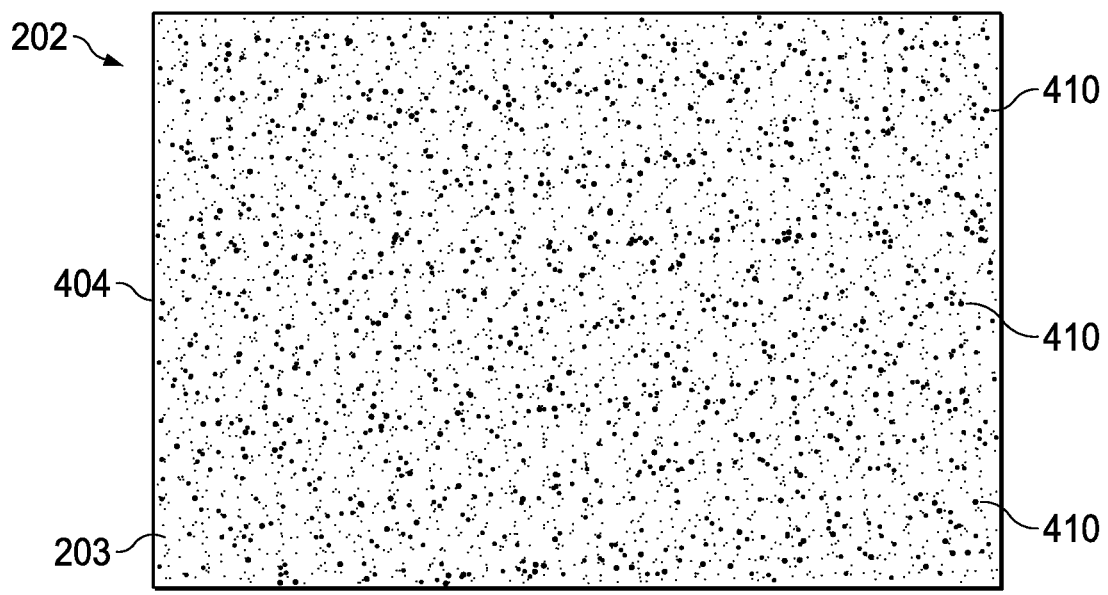
FIG. 4B is a top-down view of an illustrative textured bond pad, in accordance with various examples.

As FIG. 4A depicts, the top surface of the metal layer 400 includes a plurality of protrusions 406. These protrusions may be formed, for example, by a chemical etching process as described below, which results in a coarse top surface of the metal layer 400. Although the protrusions 406 are shown as being regular in pattern, in some examples the protrusions 406 are sized and distributed irregularly, since they are formed in some such examples by chemical etching—that is, by the direct application of a chemical etchant to the top surface of the metal layer 400. (Suitable chemical etchants may include $H_2SO_4$, $H_3PO_4$). Other suitable etching techniques, such as laser etching, also may be used. In some examples, the protrusions 406 have a height on the scale of microns, for example, between 0.01 and 0.1 microns, inclusive. The roughness produced by the protrusions may be 10-15 mean roughness units (Rz). The metal layer 402 likewise has a top surface that includes a plurality of protrusions 408. In some examples, the protrusions 408 are formed by any suitable technique, such as a chemical etch. In some examples, however, the protrusions 408 are formed by virtue of a metal layer 402 that is sufficiently thin so as to cause the protrusions 406 of the metal layer 400 to result in the formation of the protrusions 408. For example, the thickness of the metal layer 402 is between 1 and 4 microns, inclusive, in contrast to the example thickness of the metal layer 400 of 6 to 10 microns, inclusive. In some examples, the metal layer 404 is also thin (e.g., 0.1 to 0.4 microns, inclusive), such that the protrusions 408 of the metal layer 402 result in the formation of the protrusions 410 on the top surface 203 of the metal layer 404. (It is contemplated, however, that the protrusions 408 and/or 410 may be created using other techniques, such as chemical etching.) The top surface 203 of the metal layer 404 is the top surface of the textured bond pad 202. FIG. 4B depicts a top-down view of this top surface 203. As shown, the top surface 203 includes numerous protrusions 410, for example in an irregular pattern with irregular sizes. In some examples, the chemical etching of the top surface of the metal layer 400 is limited to only a portion (e.g., less than 50%) of that surface, such that the top surface 203 of the metal layer 404 (and of the textured bond pad 202) has protrusions 410 distributed across a limited area of that top surface 203. The manufacture of the illustrative, textured bond pad 202 of FIGS. 4A and 4B is described in greater detail below.

Figure 5A:
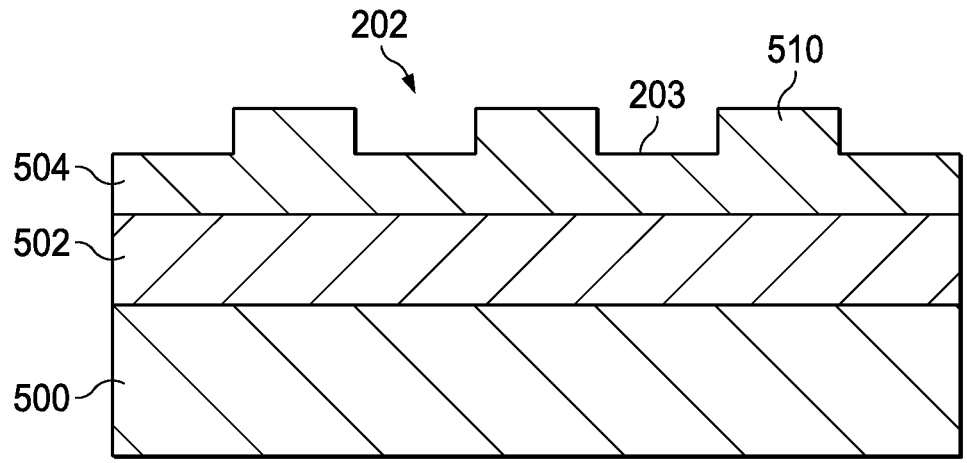
FIG. 5A is a cross-sectional view of an illustrative textured bond pad, in accordance with various examples.
Figure 5B:
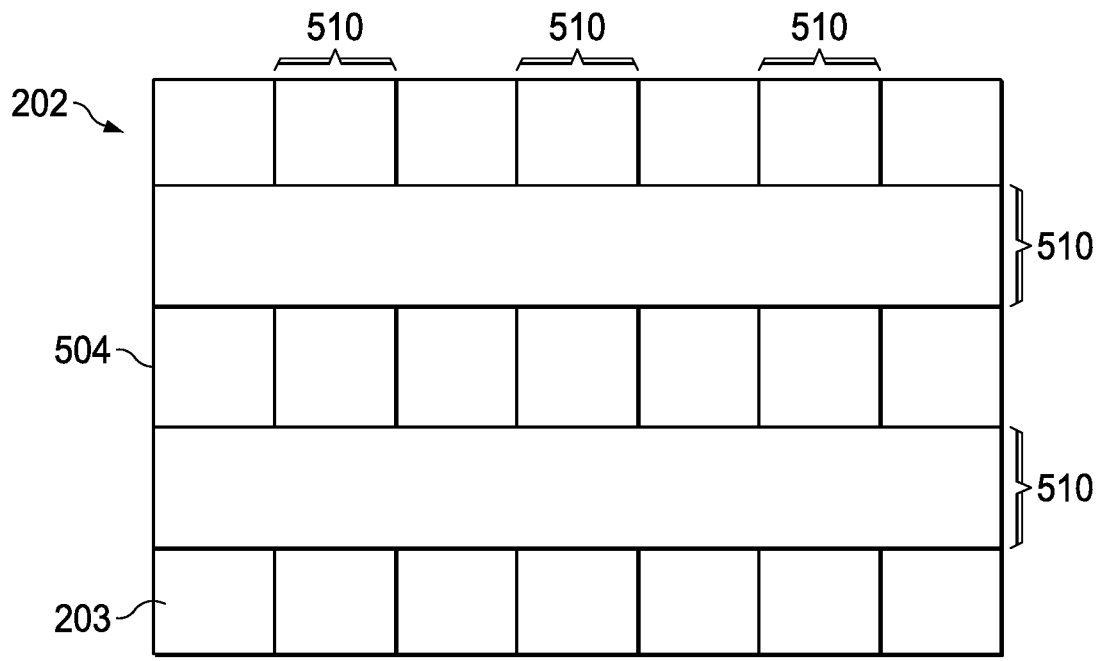
FIG. 5B is a top-down view of an illustrative textured bond pad, in accordance with various examples.

FIG. 5A is a cross-sectional view of an illustrative textured bond pad 202, in accordance with various examples. The textured bond pad 202 of FIG. 5A is similar to that depicted in FIG. 4A, with three metal layers 500, 502, and 504 corresponding to the three metal layers 400, 402, and 404. The foregoing description regarding the number, type, and configuration of metal layers in the textured bond pad 202 of FIG. 4A also applies to the textured bond pad 202 of FIG. 5A. The textured bond pad 202 of FIG. 5A differs, however, from that of FIG. 4A in that its layers are not etched. Rather, the top surfaces of the metal layers 500, 502, and 504 are smooth relative to the top surfaces of the metal layers 400, 402, and 404. However, the top surface 203 of the metal layer 504 (and, thus, the top surface of the textured bond pad 202) includes one or more protrusions 510. In some examples, these protrusions 510 are composed of the same metal as the metal layer 504 (e.g., palladium), although the scope of this disclosure is not limited as such. In some examples, these protrusions 510 are prisms, such as rectangular prisms or triangular prisms. In some examples, these protrusions 510 are spheres or half-spheres (both of which may be described as "spherical"). In some examples, various shapes, sizes, and/or quantities of protrusions 510 are used such that the surface area of the top surface of the metal layer 504 is increased so as to form a stronger wirebond. In some examples, multiple protrusions 510 are used and are arranged in a grid-like pattern, as FIG. 5B depicts. Specifically, FIG. 5B shows a top-down view of the top surface 203, which includes protrusions 510 shaped as rectangular prisms and configured in a grid-like pattern. In the depiction of FIG. 5B, the horizontally-oriented rectangular protrusions 510 are positioned above the vertically-oriented protrusions 510. Any of a variety of protrusion shapes, quantities, sizes, and configurations may be used. In some examples, the protrusions (e.g., protrusions 510) described herein are 0.01 to 0.1 microns in height (thickness), inclusive. The manufacture of the illustrative, textured bond pad 202 of FIGS. 5A and 5B is described in greater detail below.

Figure 6A:
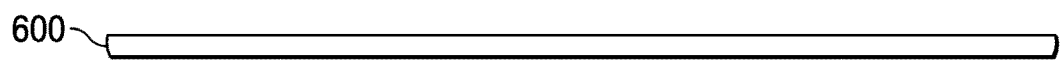
FIGS. 6A-6I are cross-sectional views depicting the fabrication of an illustrative textured bond pad, in accordance with various examples.
Figure 6B:
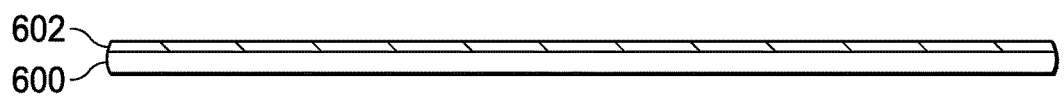
Figure 6C:
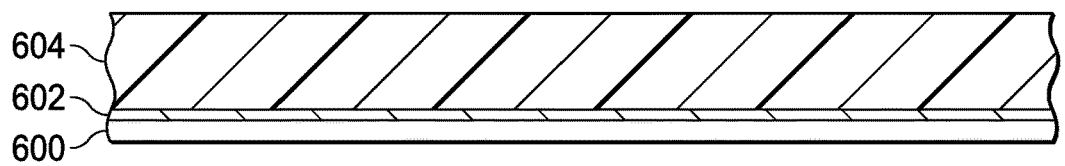
Figure 6D:
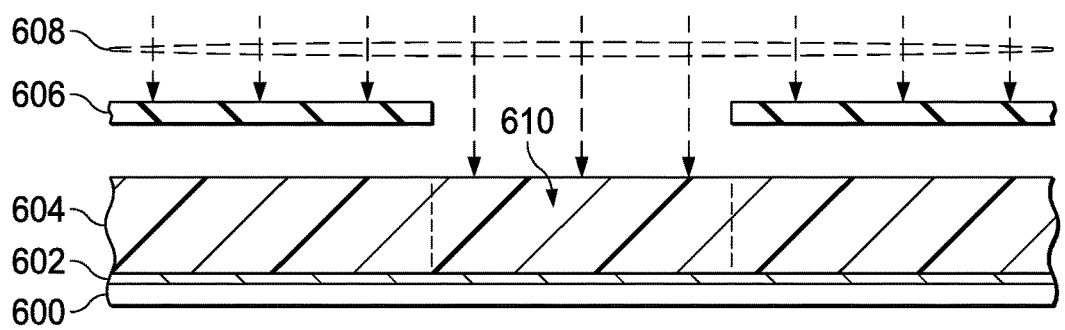
Figure 6E:
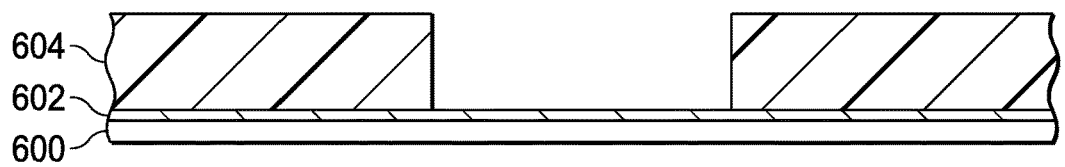
Figure 6F:
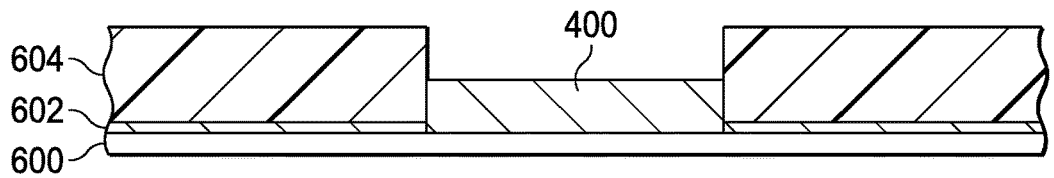

FIGS. 6A-6I are cross-sectional views depicting the fabrication of an illustrative textured bond pad (e.g., the textured bond pad 202 depicted in FIGS. 4A and 4B), in accordance with various examples. FIG. 7 is a flow diagram of a process 700 corresponding to the fabrication steps of FIGS. 6A-6I, in accordance with various examples. FIGS. 6A-6I and 7 are now described in parallel. The method 700 begins by providing a semiconductor substrate (step 702). A "substrate" may include a semiconductor wafer. Alternatively, a "substrate" may include a die (i.e., post-wafer singulation). FIG. 6A depicts a semiconductor substrate 600. The method 700 next comprises applying an electroplating seed layer to the semiconductor substrate (step 704). FIG. 6B depicts a seed layer 602, such as a copper seed layer, which may be applied via, e.g., a deposition, sputtering, or spraying technique.

The method 700 still further comprises coating the electroplating seed layer with a photoresist (step 706). FIG. 6C depicts a photoresist 604 deposited above and abutting the seed layer 602. The method 700 includes exposing the photoresist using one or more masks (step 708). FIG. 6D depicts the application of light 608 and mask 606, thereby rendering the portion 610 of the photoresist 604 soluble to a photoresist developer. The developer is applied to the photoresist at step 710, and as FIG. 6E depicts, the soluble portion 610 is removed as a result. The method 700 further includes electroplating the first metal layer using the electroplating seed layer (step 712). FIG. 6F depicts the growth of the first metal layer 400 in the space formerly occupied by the portion 610 of the photoresist 604.

Figure 6G:
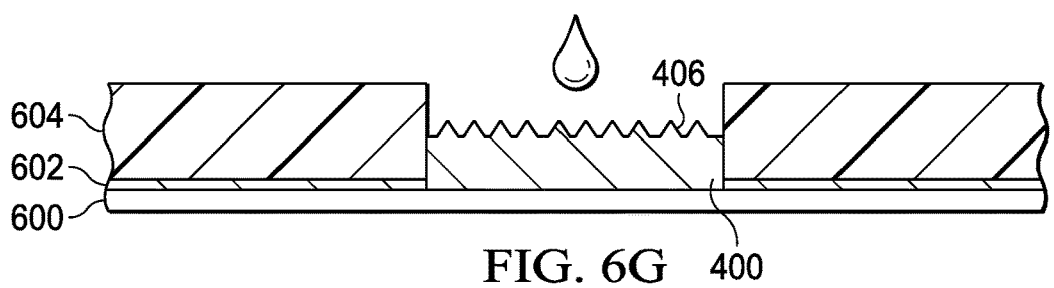
Figure 6H:
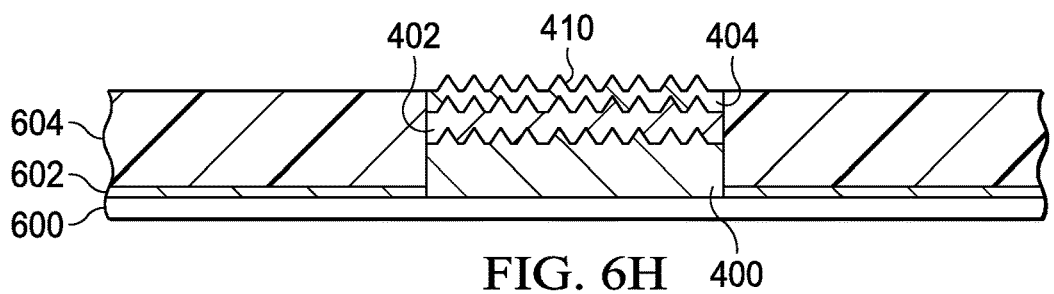
Figure 6I:
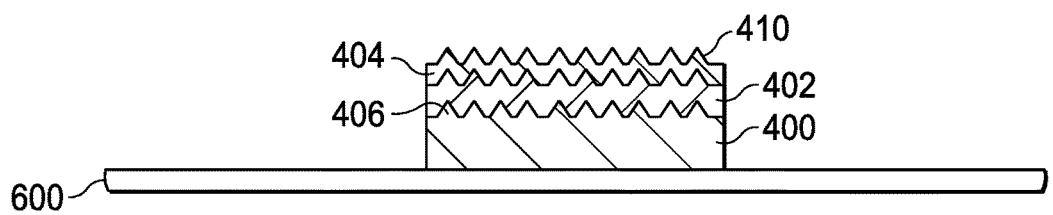
Figure 7:
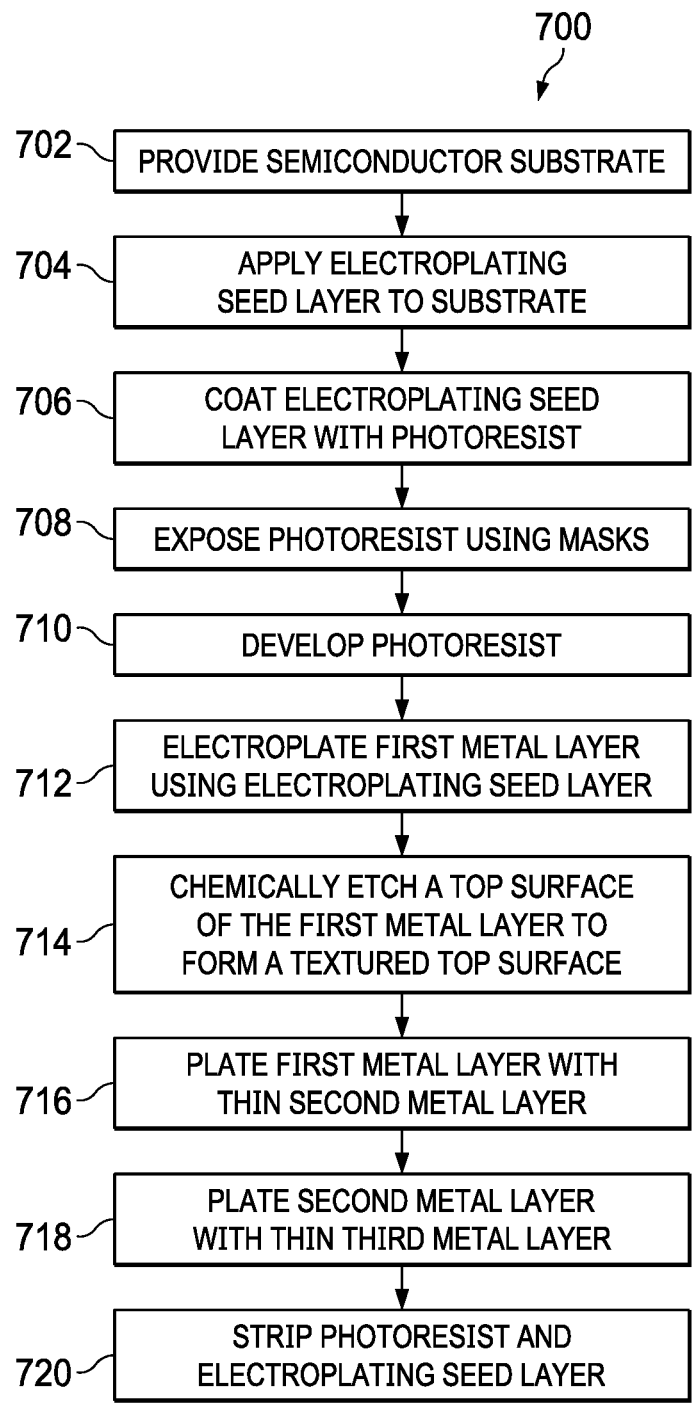
FIG. 7 is a flow diagram of a process for fabricating an illustrative textured bond pad, in accordance with various examples.

The method 700 comprises chemically etching a top surface of the first metal layer to form a textured top surface (step 714), as FIG. 6G depicts by the plurality of protrusions 406. Other etching techniques are contemplated and included in the scope of this disclosure. Step 716 includes plating the first metal layer with a thin second metal layer, and step 718 includes plating the second metal layer with a thin third metal layer, as FIG. 6H depicts with the addition of metal layers 402 and 404. As explained above, the metal layers 402 and 404 may be sufficiently thin such that, upon completion of plating, the top surface of the metal layer 404 includes protrusions 410 that are formed as a result of the protrusions of the metal layer 400. Step 720 comprises stripping the photoresist and the electroplating seed layer, as FIG. 6I depicts with the removal of the photoresist 604 and the electroplating seed layer 602.

Figure 8A:
FIGS. 8A-8M are cross-sectional views depicting the fabrication of an illustrative textured bond pad, in accordance with various examples.
Figure 8B:
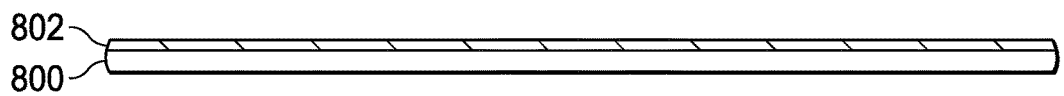
Figure 8C:
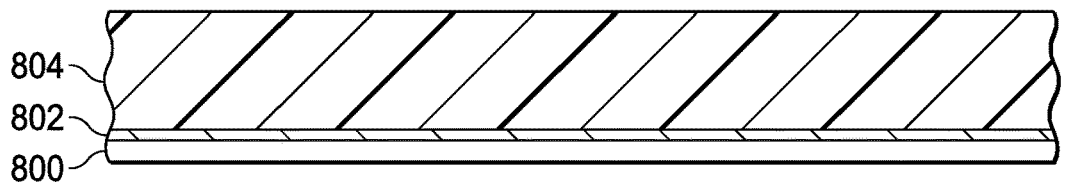
Figure 8D:
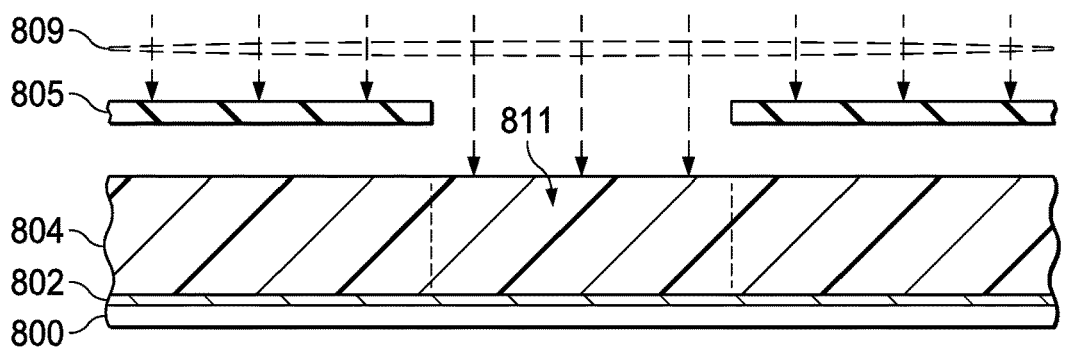
Figure 8E:
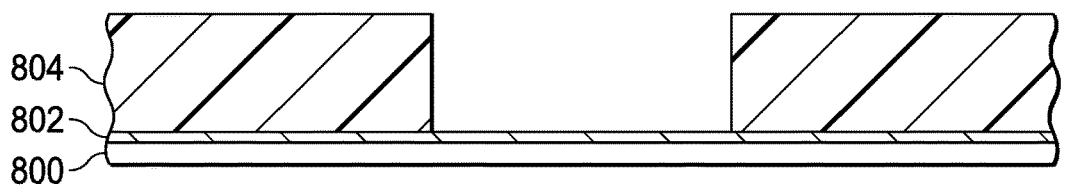
Figure 8F:
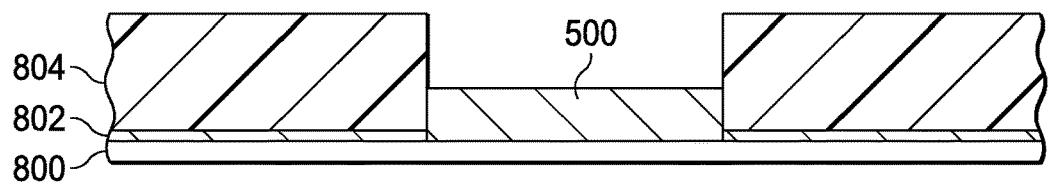
Figure 8G:
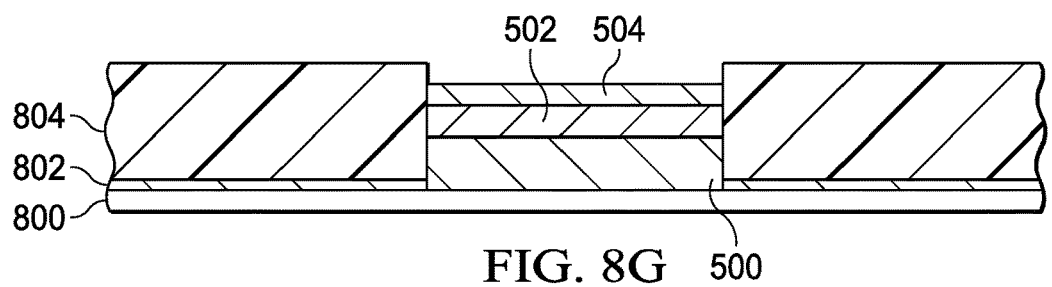

FIGS. 8A-8M are cross-sectional views depicting the fabrication of an illustrative textured bond pad, in accordance with various examples. FIG. 9 is a flow diagram of a process 900 for fabricating the illustrative textured bond pad as in FIGS. 8A-8M, in accordance with various examples. FIGS. 8A-8M and 9 are now described in parallel. The method 900 begins by providing a semiconductor substrate (step 902), as FIG. 8A depicts with the provision of the semiconductor substrate 800. Step 904 comprises applying an electroplating seed layer to the semiconductor substrate, as FIG. 8B depicts with the addition of the electroplating seed layer 802. Step 906 comprises coating the electroplating seed layer with photoresist, as FIG. 8C depicts with the addition of the photoresist 804. Step 908 comprises exposing photoresist using masks, as FIG. 8D depicts with the use of mask 805 and application of light 809, thereby creating an exposure soluble portion 811 of the photoresist 804. Step 910 comprises developing the photoresist, as FIG. 8E depicts with the removal of the portion 811. Step 912 comprises electroplating the first metal layer using the electroplating seed layer, as FIG. 8F depicts with the growth of the metal layer 500. Step 914 comprises plating the first metal layer with a second metal layer, and step 916 comprises plating the second metal layer with a third metal layer, as FIG. 8G depicts with the addition of metal layers 502 and 504.

Figure 8H:
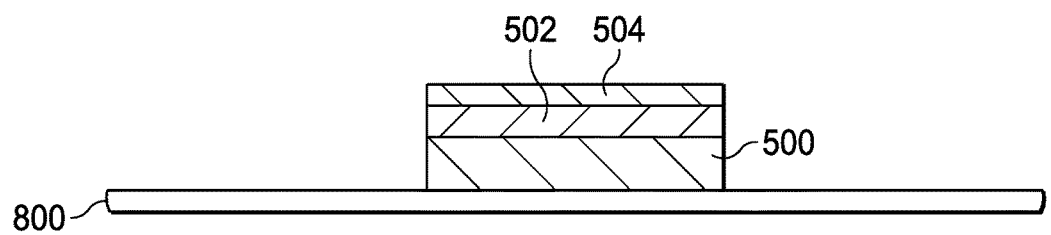
Figure 8I:
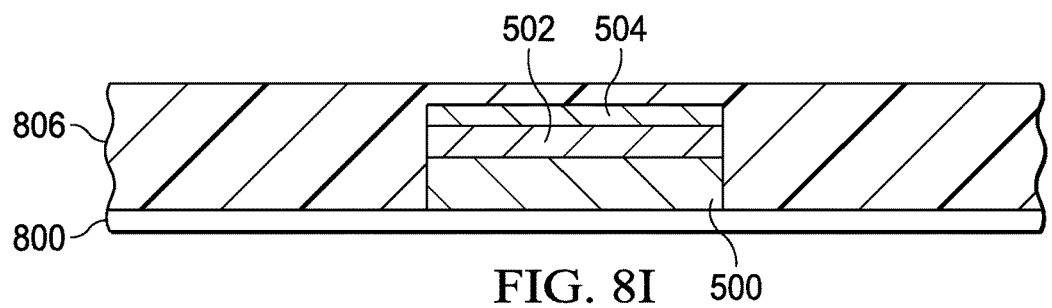
Figure 8J:
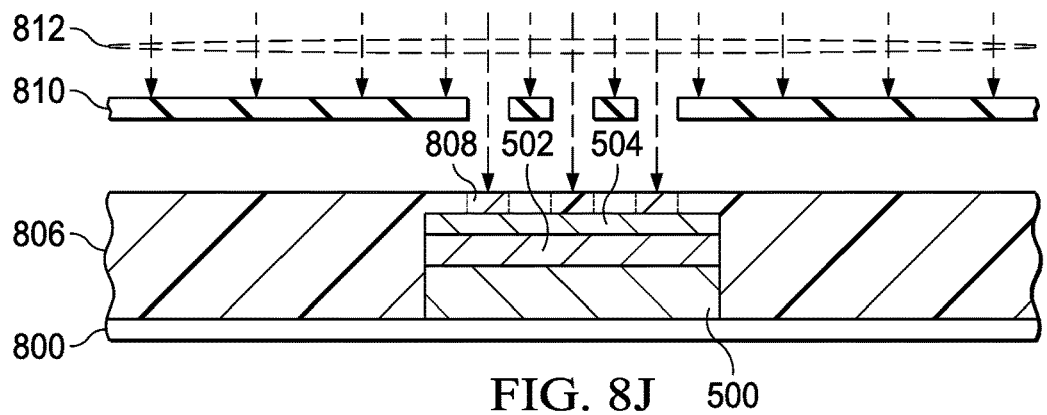
Figure 8K:
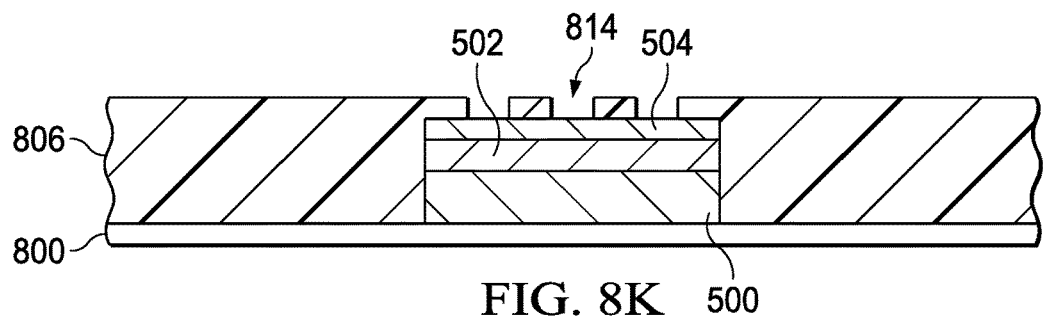
Figure 8L:
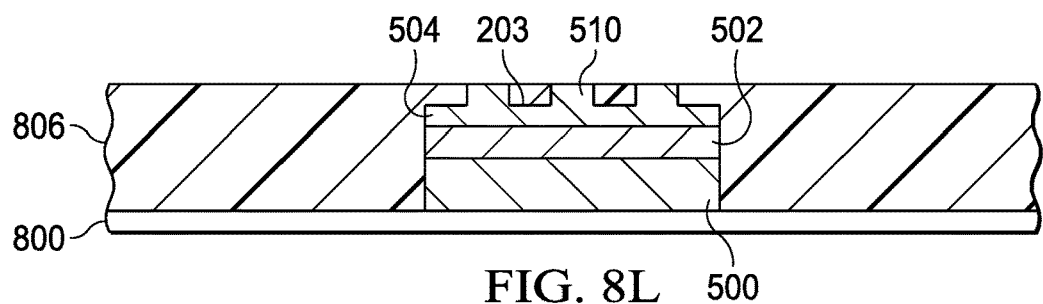
Figure 8M:
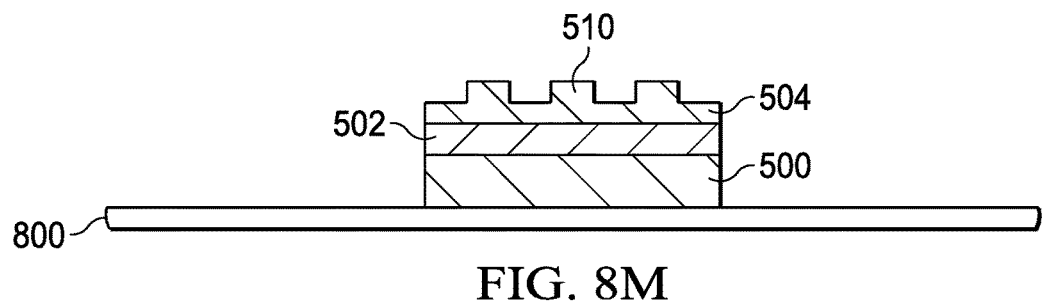
Figure 9:
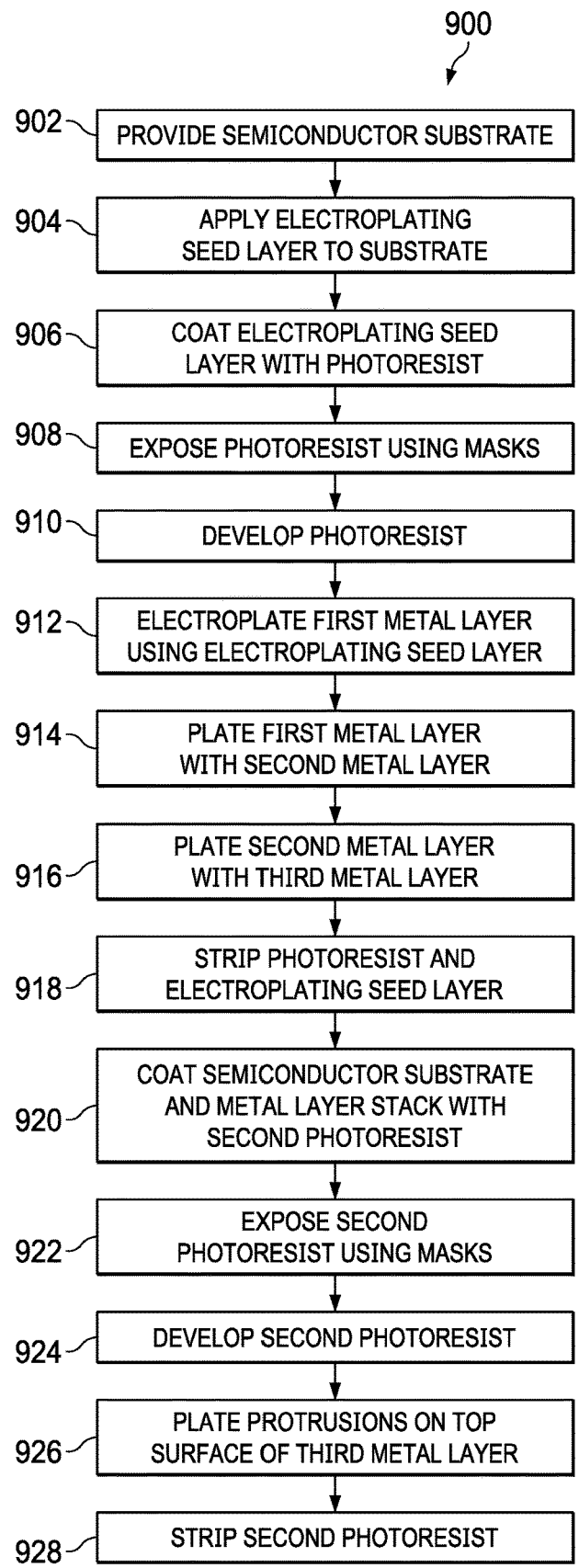
FIG. 9 is a flow diagram of a process for fabricating an illustrative textured bond pad, in accordance with various examples.

Step 918 comprises stripping the photoresist and electroplating seed layer, as FIG. 8H depicts with the removal of the photoresist 804 and the electroplating seed layer 802. Step 920 comprises coating the semiconductor substrate and the metal layer stack (e.g., the metal layer stack including the metal layers 500, 502, and 504) with a second photoresist, as FIG. 8I depicts with the addition of the photoresist 806. Step 922 comprises exposing the second photoresist using masks, as FIG. 8J depicts with the use of mask 810, the application of light 812, and the resulting creation of developer soluble portions 808 of the photoresist 806. Step 924 includes developing the second photoresist, as FIG. 8K depicts with the cavities 814 present where the soluble portions 808 were previously located. Step 926 comprises plating protrusions on the top surface of the third metal layer, as FIG. 8L depicts with the plating of protrusions 510 on the top surface 203 of the third metal layer 504. Finally, step 928 comprises stripping the second photoresist, as FIG. 8M depicts with the removal of the photoresist 806.

Figure 10A:
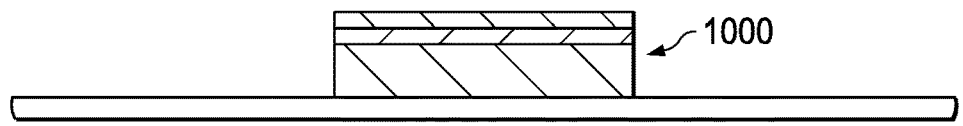
FIGS. 10A and 10B are cross-sectional views depicting the fabrication of an illustrative textured bond pad, in accordance with various examples.
Figure 10B:
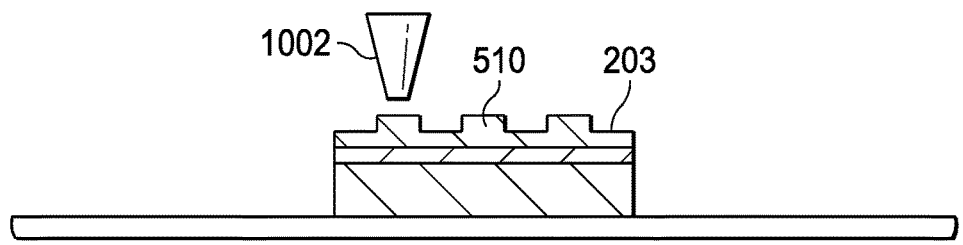
Figure 11:
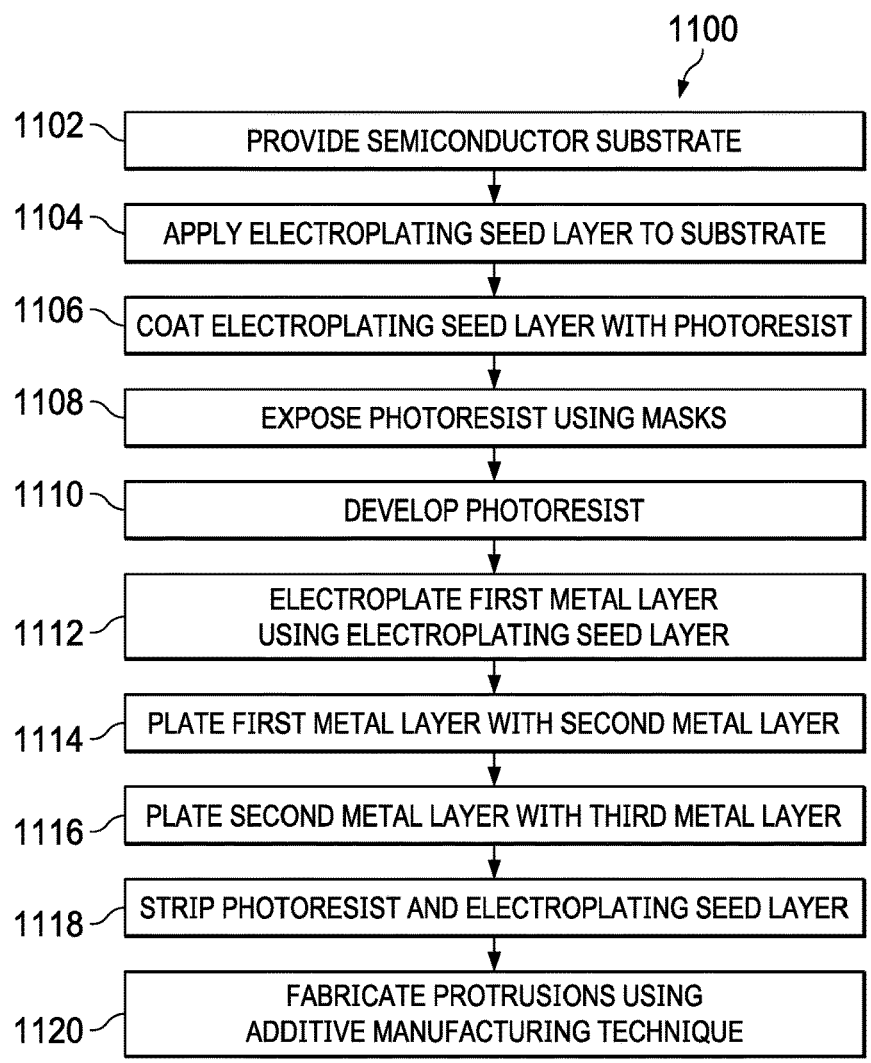
FIG. 11 is a flow diagram of a process for fabricating an illustrative textured bond pad, in accordance with various examples.

FIGS. 10A and 10B are cross-sectional views depicting the fabrication of an illustrative textured bond pad, in accordance with various examples. FIG. 11 is a flow diagram of a process 1100 for fabricating the illustrative textured bond pad of FIGS. 10A and 10B, in accordance with various examples. FIGS. 10A, 10B, and 11 are now described in parallel. The method 1100 comprises steps 1102, 1104, 1106, 1108, 1110, 1112, 1114, 1116, and 1118, which are similar to the steps 902, 904, 906, 908, 910, 912, 914, 916, and 918, respectively, of FIG. 9. Performance of these steps of method 1100 produces the metal layer stack 1000 depicted in FIG. 10A, which is similar to the metal layer stack of FIG. 8H. However, FIG. 11 differs from FIG. 9 in that FIG. 11 further includes step 1120, which includes fabricating protrusions on the top surface of the metal layer stack (e.g., metal layer stack 1000) using an additive manufacturing technique, as FIG. 10B depicts using the nozzle 1002 and the protrusions 510 printed on the surface 203. Specifically, the nozzle 1002 is part of an additive manufacturing machine (e.g., a three-dimensional printer), which is not expressly depicted in FIG. 10B. The nozzle 1002 emits any conductive material, such as metallic ink, to create the protrusions 510 on the top surface 203. As is true for other examples with protrusions 510, the protrusions 510 may be of any shape, size, configuration, etc.

Any of the foregoing techniques may be used to fabricate bond pads with any of a variety of textures. Alternatively, other techniques not specifically described herein also may be used to fabricate bond pads with any of a variety of textures. Illustrative textured bond pads have been described above. FIGS. 12A-15B depict alternative examples of textured bond pads that may be fabricated using any of the foregoing techniques or any other suitable fabrication technique (e.g., non-chemical etching, such as laser etching, or any other subtractive manufacturing process). The scope of this disclosure is not limited to any specific fabrication technique, nor is it limited to the textures of the textured bond pads described herein. FIGS. 12A-15B are now described.

Figure 12A:
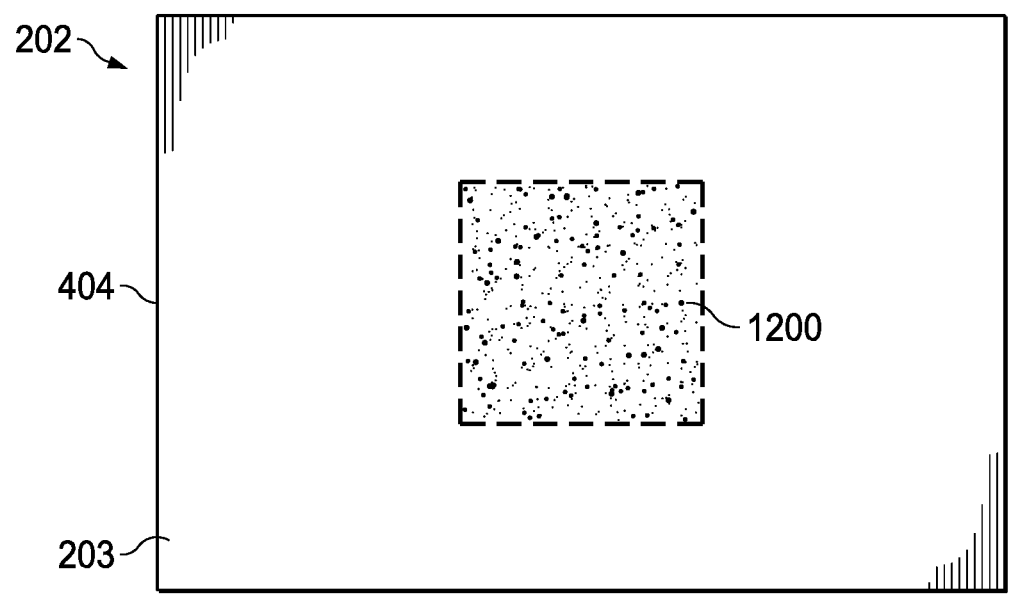
FIG. 12A is a top-down view of an illustrative textured bond pad, in accordance with various examples.
Figure 12B:
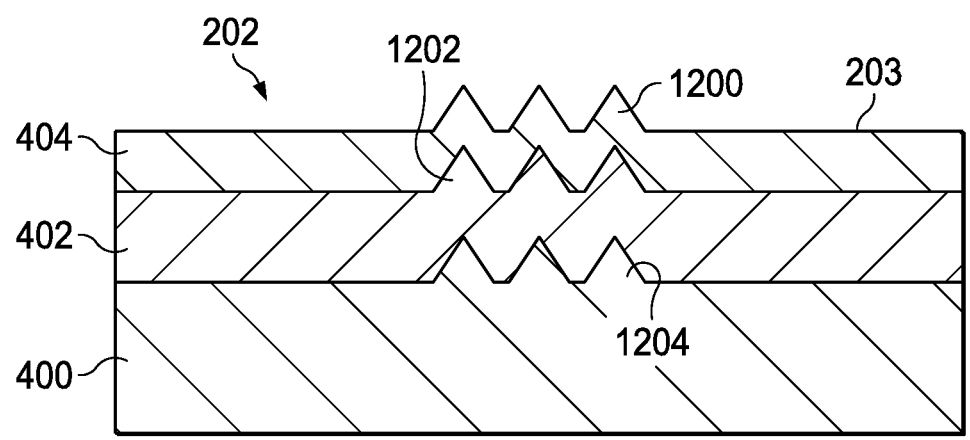
FIG. 12B is a cross-sectional view of an illustrative textured bond pad, in accordance with various examples.

FIG. 12A is a top-down view of an illustrative textured bond pad 202, in accordance with various examples. FIG. 12B is a cross-sectional view of the illustrative textured bond pad 202 of FIG. 12A, in accordance with various examples. The top-down view depicts a top surface 203 of a metal layer 404 that includes protrusions 1200 on only a limited portion (e.g., less than 50%) of the top surface 203. This is in contrast to FIGS. 4A and 4B, which depict protrusions covering a greater portion (e.g., most or all) of the top surface of the textured bond pad 202. For example, protrusions may be fabricated on only those areas at which a bond wire ball is expected to be attached. The cross-sectional view of FIG. 12B depicts metal layers 400, 402, and 404 having protrusions 1204, 1202, and 1200, respectively. These protrusions may be formed as described above and may be similar to those formed in FIGS. 4A and 4B (e.g., via an etching process). As with the other protrusions described herein, the protrusions 1200 increase the strength with which a bond wire ball adheres to the textured bond pad 202.

Figure 13A:
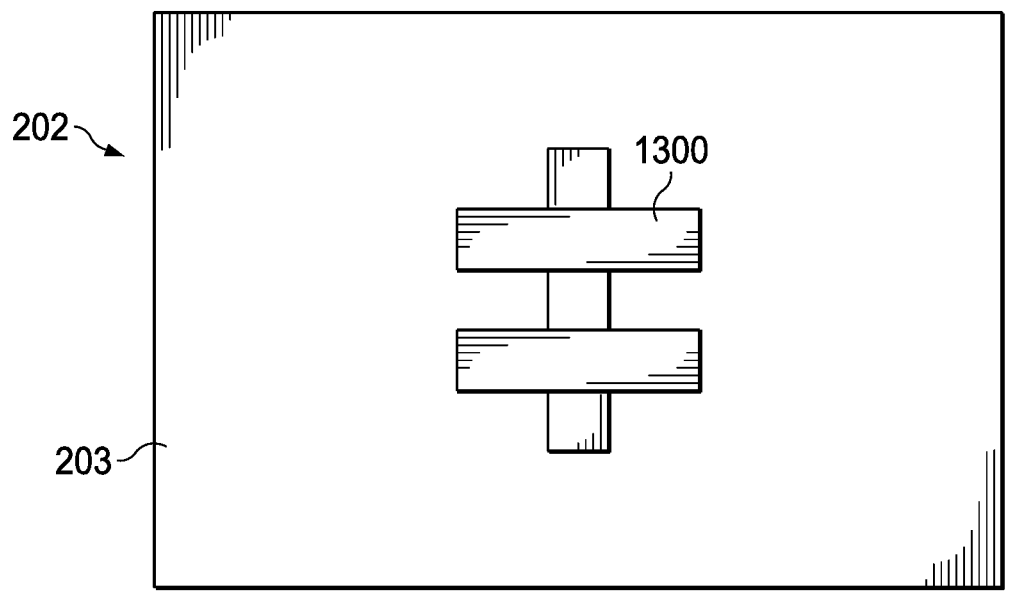
FIG. 13A is a top-down view of an illustrative textured bond pad, in accordance with various examples.
Figure 13B:
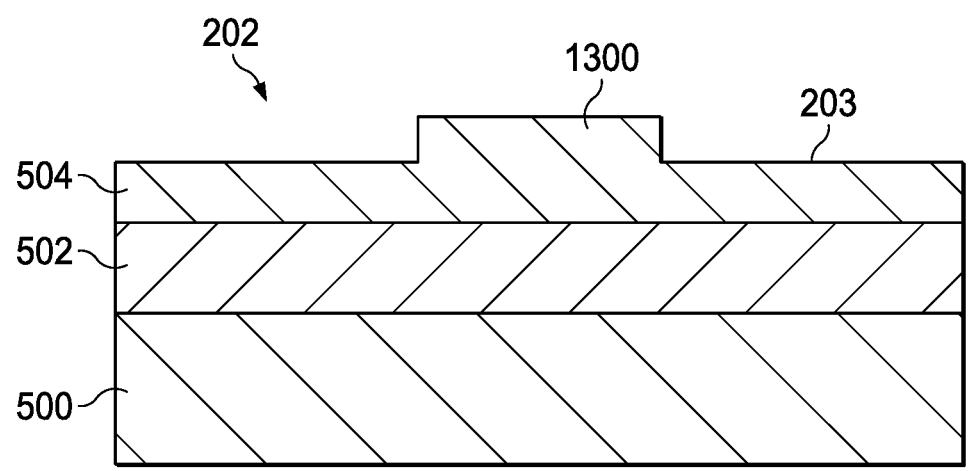
FIG. 13B is a cross-sectional view of an illustrative textured bond pad, in accordance with various examples.

FIG. 13A is a top-down view of an illustrative textured bond pad 202, in accordance with various examples. FIG. 13B is a cross-sectional view of the illustrative textured bond pad 202 of FIG. 13B, in accordance with various examples. The top surface 203 of the textured bond pad 202 includes a plurality of protrusions 1300. The protrusions 1300 are shaped as rectangular prisms and are arranged in a stacked configuration, with each protrusion abutting another protrusion. (In some examples, each individual prism may be referred to as a separate protrusion; in other examples, the collection of prisms may be referred to as a single protrusion.) As with the protrusions 1200 of FIGS. 12A and 12B, the protrusions 1300 cover a limited area (e.g., less than 50%) of the top surface 203, e.g., the area to which a bond wire ball may attach. The cross-sectional view of FIG. 13B depicts metal layers 500, 502, and 504, with the protrusions 1300 positioned on the top surface 203.

Figure 14A:
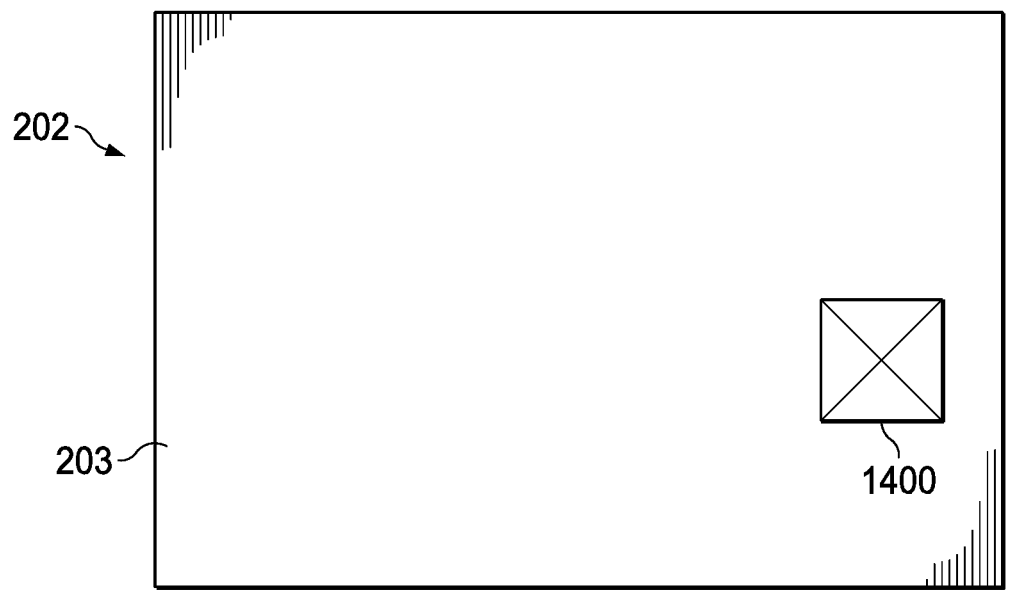
FIG. 14A is a top-down view of an illustrative textured bond pad, in accordance with various examples.
Figure 14B:
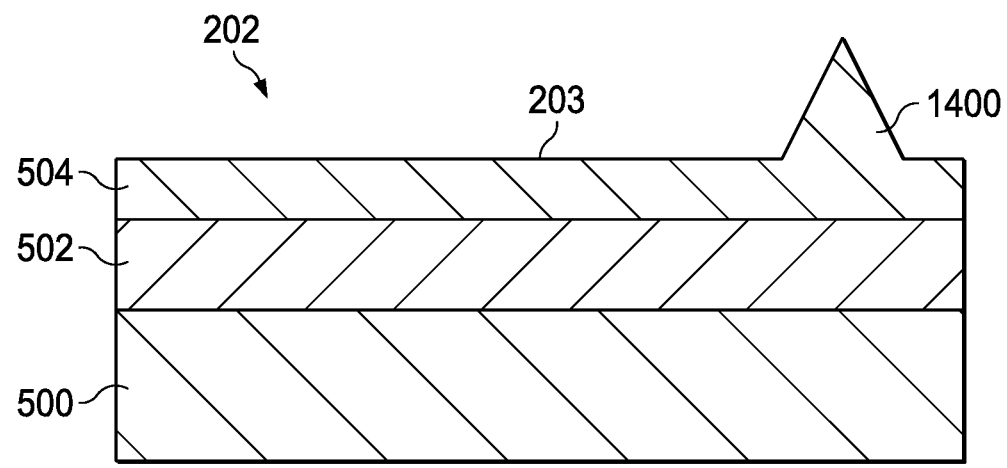
FIG. 14B is a cross-sectional view of an illustrative textured bond pad, in accordance with various examples.

FIG. 14A is a top-down view of an illustrative textured bond pad 202, in accordance with various examples. FIG. 14B is a cross-sectional view of the illustrative textured bond pad 202 of FIG. 14A, in accordance with various examples. The top surface 203 of the textured bond pad 202 includes a protrusion 1400, which in this example is shaped as a triangular prism and is limited to only a portion (e.g., less than 50%) of the top surface 203 to which a bond wire ball might couple (e.g., as opposed to having numerous protrusions covering most or all of the top surface 203). The cross-sectional view of FIG. 14B depicts the protrusion 1400 positioned on top surface 203, with metal layers 504, 502, and 500 composing the textured bond pad 202. As with the protrusions described above, the protrusion 1400 increases the strength of the bond with bond wire balls. Although FIGS. 14A and 14B show the protrusion 1400 not centered on the top surface 203, in some examples, the protrusion 1400 is centered on top surface 203, or is positioned in any other suitable location on top surface 203.

Figure 15A:
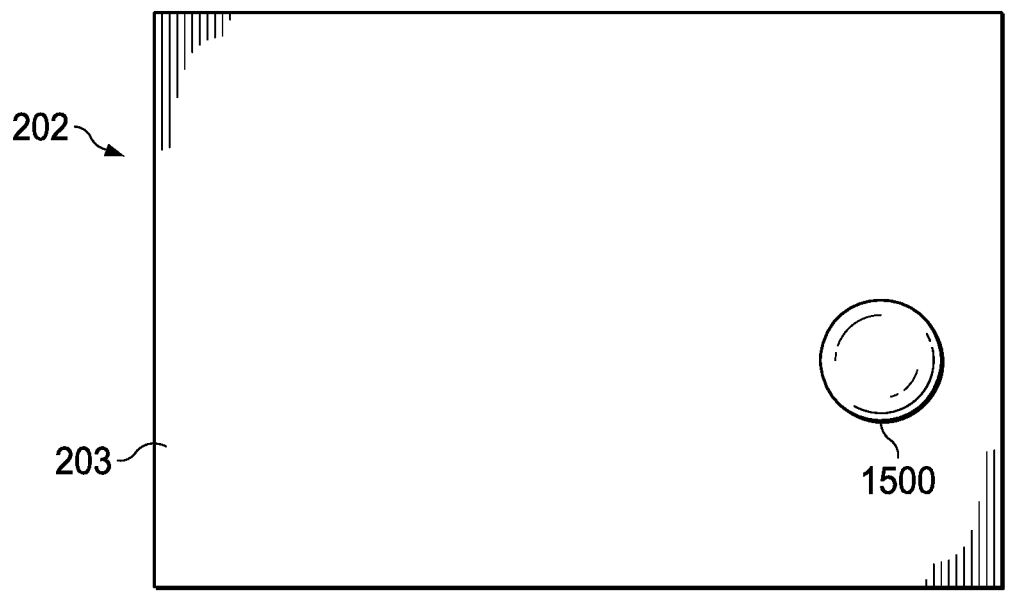
FIG. 15A is a top-down view of an illustrative textured bond pad, in accordance with various examples.
Figure 15B:
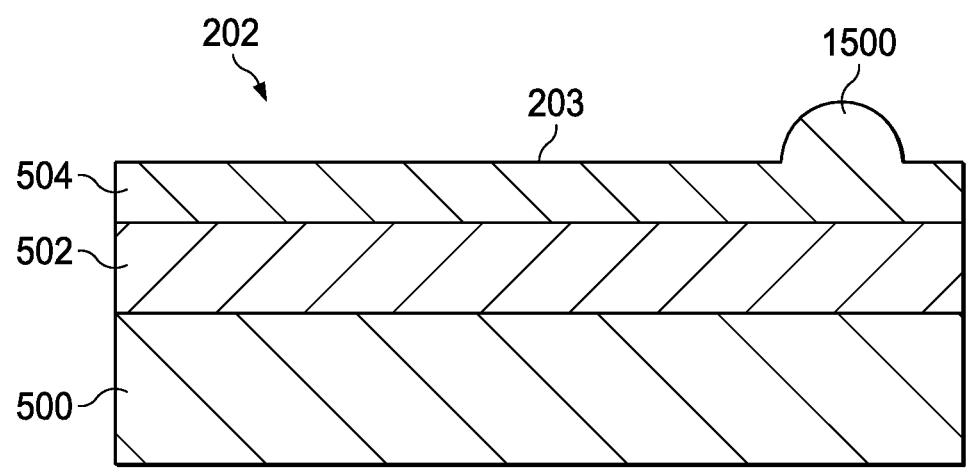
FIG. 15B is a cross-sectional view of an illustrative textured bond pad, in accordance with various examples.

FIG. 15A is a top-down view of an illustrative textured bond pad 202, in accordance with various examples. FIG. 15B is a cross-sectional view of the illustrative textured bond pad 202 of FIG. 15A, in accordance with various examples. A protrusion 1500 is positioned on the top surface 203 of the textured bond pad 202, for example in a limited area (e.g., less than 50% of the top surface) at which a bond wire ball may be coupled. In this example, the protrusion 1500 comprises a half-sphere, and FIG. 15B depicts a cross-sectional view of the spherical protrusion 1500 on the top surface 203. The scope of this disclosure encompasses the possibility of covering some, most, or all of the top surface 203 with protrusions, including triangular prisms, rectangular prisms, spheres, half-spheres, and any and all other protrusion shapes. Some protrusion shapes, sizes, and positions may be more advantageous than others, and thus such shapes, sizes, and/or positions may find utility beyond mere design choice. Any and all such possibilities fall within the scope of this disclosure. Although FIGS. 15A and 15B show the protrusion 1500 not centered on the top surface 203, in some examples, the protrusion 1500 is centered on top surface 203, or is positioned in any other suitable location on top surface 203.

Figure 16:
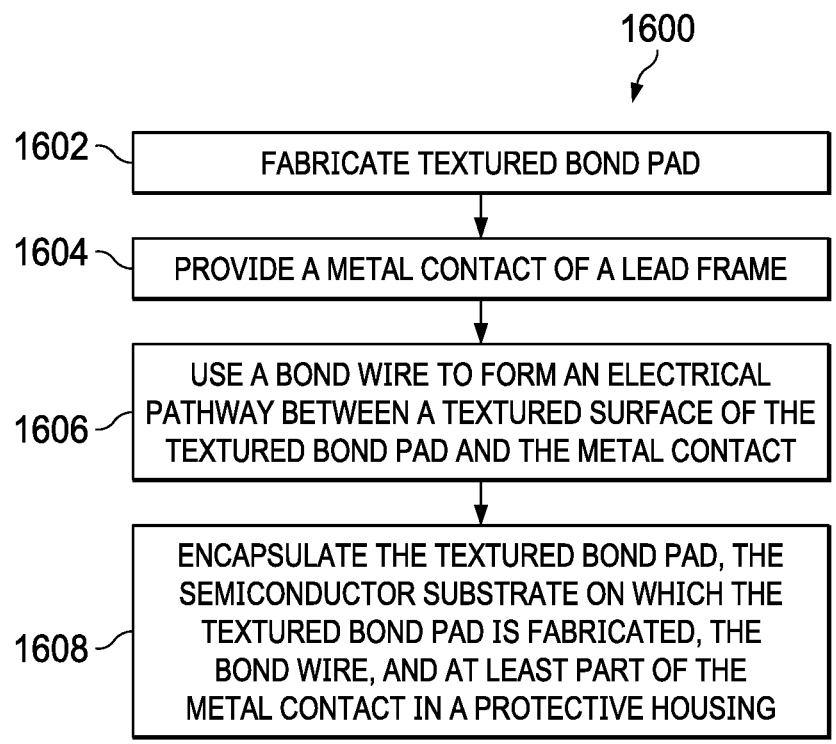
FIG. 16 depicts a flow diagram of a method for fabricating a semiconductor device having a textured bond pad, in accordance with various examples.

FIG. 16 depicts a flow diagram of a method 1600 for fabricating a semiconductor device in accordance with various examples. The method 1600 begins by fabricating a textured bond pad (step 1602). The textured bond pad is fabricated on a semiconductor substrate on and/or in which other circuitry is also fabricated, and the textured area may have any of the qualities described in this disclosure. In addition, the textured bond pad may be fabricated using any of the techniques described or alluded to in this disclosure. The method 1600 then includes providing a metal contact of a lead frame (step 1604). The metal contact is, for example, a lead. The method 1600 further comprises using a bond wire to form an electrical pathway between a textured surface of the textured bond pad and the metal contact (step 1606). The ends of the bond wire may be heated and shaped to form balls, with one of the balls pressed and coupled to the metal contact, and the other ball pressed and coupled to the textured area of the textured bond pad. The method 1600 also includes encapsulating the textured bond pad, the semiconductor substrate, the bond wire, and at least part of the metal contact in a protective housing (e.g., epoxy/molding) (step 1608).

A number of issues may be encountered during production of semiconductor packages containing textured bond pads that may easily be overcome. For example, textured bond pads present rougher (or less smooth) surfaces that may be challenging for bump inspection. This issue may be overcome by adjusting auto visual inspection (AVI) system parameters to account for rougher surfaces. In examples where the protrusions (i.e., the textured area) is limited to only a portion of the top surface of the bond pad, zones may be created in the AVI system to account for the textured areas. In addition, the protrusions of the textured areas may be of a thickness such that bond strength is enhanced, but such that the manufacturing flow does not require modification to account for the protrusions. Example protrusion thicknesses are provided above. In addition, although etching techniques may create uniform roughness profiles (i.e., a uniform distribution of protrusions), in some examples this may not be the case. Nevertheless, even with non-uniform roughness profiles, enhanced bonding strength may be achieved. Thus, the textured bond pads disclosed herein provide a significant technical advantage in terms of enhanced bond strength, without presenting any significantly deleterious effects on production flow, cost, or build quality.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A package, comprising:
a semiconductor die;
a bond pad formed upon the semiconductor die, the bond pad having a protrusion on a top surface of the bond pad;
a metal contact; and
a bond wire coupled to the protrusion and to the metal contact.

2. The package of claim 1, wherein the protrusion comprises a rectangular prism.

3. The package of claim 1, wherein the bond pad has multiple protrusions on the top surface of the bond pad.

4. The package of claim 3, wherein a first protrusion of the multiple protrusions is positioned on top of a second protrusion of the multiple protrusions.

5. The package of claim 1, wherein the protrusion comprises a triangular prism.

6. The package of claim 1, wherein the protrusion is spherical.

7. The package of claim 1, wherein the protrusion has a thickness of between 0.01 microns and 0.1 microns, inclusive.

8. The package of claim 1, wherein the protrusion occupies less than 50% of the top surface.

9. The package of claim 1, wherein the bond pad comprises:
a first metal layer;
a second metal layer on the first metal layer; and
a third metal layer on the second metal layer, the third metal layer having the top surface having the protrusion.

10. The package of claim 9, wherein the first metal layer comprises copper, the second metal layer comprises nickel, and the third metal layer comprises palladium.

11. The package of claim 1, wherein the protrusion is part of a textured surface on the top surface.

12. The package of claim 11, wherein the bond pad comprises multiple metal layers.

13. The package of claim 12, wherein the multiple metal layers include a copper layer, a palladium layer, and a nickel layer positioned between the copper and palladium layers.

14. The package of claim 13, wherein the copper layer has a thickness between 6 and 10 microns, inclusive.

15. The package of claim 13, wherein the top surface of the copper layer is chemically etched.

16. The package of claim 13, wherein the nickel layer has a thickness between 1 and 4 microns, inclusive.

17. The package of claim 13, wherein the palladium layer has a thickness between 0.1 and 0.4 microns, inclusive.

18. A semiconductor device, comprising:
a semiconductor substrate;
a metal layer on the semiconductor substrate, a top surface of the metal layer forming a textured top surface;
a metal contact of a leadframe;
a bond wire forming an electrical pathway between the metal contact and the textured top surface of the metal layer; and
a mold material covering the semiconductor substrate, the textured top surface, the bond wire, and at least a portion of the metal contact in a protective housing.

19. The device of claim 18, wherein the metal layer comprises a copper layer.

20. The device of claim 19, wherein the semiconductor substrate comprises a copper seed layer.

21. The device of claim 18, further comprising a second metal layer on the metal layer, the second metal layer being sufficiently thin such that the textured top surface of the metal layer causes a top surface of the second metal layer to be textured.

22. The device of claim 21, further comprising a third metal layer on the second metal layer, the third metal layer being sufficiently thin such that the textured top surface of the second metal layer causes a top surface of the third metal layer to be textured.

23. The device of claim 22, wherein the metal layer comprises copper, the second metal layer comprises nickel, and the third metal layer comprises palladium.

24. The device of claim 18, further comprising using a photoresist to position the bond pad on the semiconductor substrate.

25. The device of claim 18, wherein the protective housing comprises epoxy.

26. A semiconductor device, comprising:
a semiconductor substrate;
a bond pad on the semiconductor substrate, wherein the bond pad includes:

a stack of metal layers on the semiconductor substrate; and a protrusion on a top surface of the stack of metal layers;

a metal contact of a leadframe;

a bond wire forming an electrical pathway between the metal contact and the protrusion; and a mold material covering the semiconductor substrate, the bond pad, the bond wire, and at least a portion of the metal contact in a protective housing.

27. The device of claim 26, wherein the protrusion is formed using a photolithography technique.

28. The device of claim 26, wherein the protrusion is formed using an additive manufacturing technique.

29. The device of claim 26, wherein the protrusion is formed using a rectangular prism.

30. The device of claim 26, further comprising a second protrusion abutting the protrusion.

* * * * *